(12) United States Patent
Tanaka

(10) Patent No.: US 11,664,644 B2
(45) Date of Patent: May 30, 2023

(54) WAVELENGTH TUNABLE LIGHT SOURCE, OPTICAL TRANSMISSION APPARATUS USING THE SAME, AND METHOD OF CONTROLLING WAVELENGTH TUNABLE LIGHT SOURCE

(71) Applicant: FUJITSU LIMITED, Kawasaki (JP)

(72) Inventor: Shinsuke Tanaka, Hiratsuka (JP)

(73) Assignee: FUJITSU LIMITED, Kawasaki (JP)

( * ) Notice: Subject to any disclaimer, the term of this patent is extended or adjusted under 35 U.S.C. 154(b) by 75 days.

(21) Appl. No.: 17/028,307

(22) Filed: Sep. 22, 2020

(65) Prior Publication Data
US 2021/0126421 A1  Apr. 29, 2021

(30) Foreign Application Priority Data
Oct. 24, 2019   (JP) .............................. JP2019-193560

(51) Int. Cl.
*H01S 5/40*  (2006.01)
*H01S 5/10*  (2021.01)
(Continued)

(52) U.S. Cl.
CPC .......... *H01S 5/4087* (2013.01); *H01S 5/1007* (2013.01); *H01S 5/1092* (2013.01);
(Continued)

(58) Field of Classification Search
CPC .... H01S 5/4068; H01S 5/4062; H01S 5/4087; H01S 5/1092; H01S 5/141–142;
(Continued)

(56) References Cited

U.S. PATENT DOCUMENTS 4,760,580 A * 7/1988 Thompson ........... G02B 6/2804
372/50.12
5,222,167 A * 6/1993 Jean ..................... G02B 6/2804
385/39
(Continued)

FOREIGN PATENT DOCUMENTS

CN   103370112 A  * 10/2013  ............. H01S 5/141
CN   108767656 A  * 11/2018
(Continued)

OTHER PUBLICATIONS

JPOA—Office Action of Japanese Patent Application No. 2019-193560 dated Mar. 7, 2023 with English Machine translation. **
Reference JP2006-005531 was previously cited by the Examiner on Mar. 25, 2022.

*Primary Examiner* — Joshua King
(74) *Attorney, Agent, or Firm* — Fujitsu Patent Center

(57) ABSTRACT

A wavelength tunable light source includes: a common wavelength filter that has periodic transmission peak wavelengths or reflection peak wavelengths and is commonly used for a plurality of channels; a wavelength tunable filter that is coupled to the common wavelength filter and has a one-input and multiple-output configuration which has a plurality of output ports, and that has a plurality of transmission peak wavelengths corresponding to the plurality of channels at the plurality of output ports; and a plurality of gain media optically coupled to the plurality of output ports of the wavelength tunable filter, wherein a plurality of laser cavities that perform laser oscillation at a plurality of different wavelengths are formed between the common wavelength filter and the plurality of gain media.

14 Claims, 10 Drawing Sheets

(51) Int. Cl.
*H01S 5/14* (2006.01)
*H01S 5/50* (2006.01)

(52) U.S. Cl.
CPC ............ *H01S 5/142* (2013.01); *H01S 5/4062* (2013.01); *H01S 5/4068* (2013.01); *H01S 5/4025* (2013.01); *H01S 5/5027* (2013.01)

(58) Field of Classification Search
CPC .. H01S 5/1007; H01S 5/06255; H01S 5/0622; H01S 5/0687; H01S 5/0651; H01S 5/0653; H01S 5/5027; H01S 5/40–4093; H01S 3/10023–1003; H01S 3/106–1095; H01S 3/2383–2391
See application file for complete search history.

(56) References Cited

U.S. PATENT DOCUMENTS

| | | | | |
|---|---|---|---|---|
| 5,333,219 | A * | 7/1994 | Kuznetsov | G02F 1/2257 359/344 |
| 5,915,051 | A * | 6/1999 | Damask | G02B 6/12007 385/9 |
| 6,434,175 | B1 * | 8/2002 | Zah | H01S 5/4025 372/20 |
| 6,459,829 | B1 * | 10/2002 | Yamauchi | H04B 10/506 385/11 |
| 6,603,898 | B2 * | 8/2003 | Doerr | G02B 6/12021 385/24 |
| 6,631,145 | B1 * | 10/2003 | Tamura | H01S 5/065 372/18 |
| 6,665,320 | B1 * | 12/2003 | Arbore | H01S 5/4062 372/6 |
| 6,757,499 | B1 * | 6/2004 | Aoki | H04B 10/504 398/198 |
| 7,116,867 | B2 * | 10/2006 | Takahashi | G02B 6/125 385/39 |
| 8,885,679 | B1 * | 11/2014 | Roth | H01S 5/06246 372/29.022 |
| 9,042,008 | B2 * | 5/2015 | Saito | H01S 5/4062 359/344 |
| 9,118,165 | B1 * | 8/2015 | Norberg | H01S 3/08027 |
| 9,344,196 | B1 * | 5/2016 | Mashanovitch | H04B 10/5561 |
| 9,525,492 | B2 * | 12/2016 | Duan | H04B 10/506 |
| 9,780,528 | B1 * | 10/2017 | Zheng | H01S 5/1071 |
| 10,038,301 | B1 * | 7/2018 | Eggleston | H01S 5/0078 |
| 10,594,109 | B2 * | 3/2020 | Zilkie | H01S 5/124 |
| 10,893,342 | B2 * | 1/2021 | Mir Shafiei | H04Q 11/0062 |
| 2002/0044575 | A1 * | 4/2002 | May | H01S 5/0687 372/20 |
| 2002/0085609 | A1 * | 7/2002 | Ksendzov | H01S 5/141 372/94 |
| 2003/0099439 | A1 * | 5/2003 | Ionov | H01S 3/06754 385/48 |
| 2004/0208428 | A1 * | 10/2004 | Kikuchi | H04B 10/503 385/24 |
| 2005/0175047 | A1 * | 8/2005 | Cheng | H01S 5/4062 372/29.02 |
| 2005/0243874 | A1 * | 11/2005 | Paoletti | H01S 5/4031 372/20 |
| 2006/0127006 | A1 * | 6/2006 | Kwon | G02B 6/2938 385/37 |
| 2007/0133632 | A1 * | 6/2007 | Doerr | H01S 5/026 372/18 |
| 2009/0279576 | A1 * | 11/2009 | Joyner | H04B 10/505 372/96 |
| 2010/0085991 | A1 * | 4/2010 | Okayama | H01S 5/026 372/99 |
| 2010/0189143 | A1 * | 7/2010 | Fukuda | H01S 5/026 372/50.1 |
| 2010/0202776 | A1 * | 8/2010 | Kakitsuka | H04B 10/541 398/79 |
| 2010/0316074 | A1 * | 12/2010 | Fukuda | H01S 5/06256 372/43.01 |
| 2010/0316378 | A1 * | 12/2010 | Yeh | H01S 5/4062 398/58 |
| 2011/0134942 | A1 * | 6/2011 | Karni | H01S 5/4062 372/18 |
| 2011/0235659 | A1 * | 9/2011 | Fukuda | H01S 5/4087 372/20 |
| 2013/0243013 | A1 * | 9/2013 | Yoon | H01S 3/10 372/20 |
| 2015/0207291 | A1 * | 7/2015 | Rickman | H01S 5/14 372/20 |
| 2015/0222089 | A1 * | 8/2015 | Jeong | H01S 5/142 359/346 |
| 2015/0236809 | A1 * | 8/2015 | Dong | H01S 5/142 398/79 |
| 2015/0333475 | A1 * | 11/2015 | Blumenthal | H01S 5/0206 372/27 |
| 2016/0013609 | A1 * | 1/2016 | Doerr | H01S 5/1032 372/9 |
| 2016/0315451 | A1 * | 10/2016 | de Valicourt | H01S 5/141 |
| 2017/0010419 | A1 * | 1/2017 | Jiang | H01S 5/5027 |
| 2017/0040775 | A1 * | 2/2017 | Takabayashi | H01S 5/50 |
| 2017/0110850 | A1 * | 4/2017 | Li | H01S 5/4087 |
| 2017/0179671 | A1 | 6/2017 | Takabayashi et al. | |
| 2018/0248334 | A1 * | 8/2018 | Ummy | H01S 3/06787 |
| 2018/0366901 | A1 * | 12/2018 | Shim | G02B 6/12004 |
| 2018/0366915 | A1 * | 12/2018 | Zilkie | G02B 6/29344 |
| 2019/0199057 | A1 * | 6/2019 | Wen | H01S 5/0234 |
| 2019/0199062 | A1 * | 6/2019 | Ma | H01S 5/06821 |

FOREIGN PATENT DOCUMENTS

| | | | | | |
|---|---|---|---|---|---|
| EP | 3584893 | A1 * | 12/2019 | | G01S 17/42 |
| JP | 2003510822 | A * | 3/2003 | | |
| JP | 2006005531 | A * | 1/2006 | | |
| JP | 2006-171706 | | 6/2006 | | |
| JP | 2010-171329 | | 8/2010 | | |
| JP | 2015094812 | A * | 5/2015 | | |
| JP | 2016-018983 | A | 2/2016 | | |
| JP | 2017098362 | A * | 6/2017 | | |
| JP | 2018085475 | A * | 5/2018 | | |
| KR | 20150104385 | A * | 9/2015 | | |
| WO | WO-9848495 | A2 * | 10/1998 | | H01S 5/4062 |
| WO | WO-9933152 | A1 * | 7/1999 | | H01S 3/094003 |
| WO | WO-9937002 | A1 * | 7/1999 | | H01S 5/4062 |
| WO | WO-03102659 | A2 * | 12/2003 | | B82Y 20/00 |
| WO | WO-2007107186 | A1 * | 9/2007 | | H01S 5/0612 |
| WO | 2016/042658 | A1 | 3/2016 | | |
| WO | WO-2016187564 | A1 * | 11/2016 | | C12Q 1/00 |
| WO | WO-2017128214 | A1 * | 8/2017 | | H01S 5/0268 |
| WO | WO-2017131879 | A1 * | 8/2017 | | |
| WO | WO-2018215388 | A1 * | 11/2018 | | A61B 5/0002 |
| WO | WO-2019122369 | A1 * | 6/2019 | | G01J 3/0218 |

* cited by examiner

WAVELENGTH TUNABLE LIGHT SOURCE, OPTICAL TRANSMISSION APPARATUS USING THE SAME, AND METHOD OF CONTROLLING WAVELENGTH TUNABLE LIGHT SOURCE

CROSS-REFERENCE TO RELATED APPLICATION

This application is based upon and claims the benefit of priority of the prior Japanese Patent Application No. 2019-193560, filed on Oct. 24, 2019, the entire contents of which are incorporated herein by reference.

FIELD

The embodiments discussed herein are related to a wavelength tunable light source, an optical transmission apparatus using the same, and a method of controlling the wavelength tunable light source.

BACKGROUND

In order to increase the communication capacity, wavelength division multiplexing optical communication is performed. In particular, in dense wavelength division multiplexing (DWDM) in which a large number of wavelengths are multiplexed at narrow wavelength intervals, optical signals of several tens of wavelengths or more are multiplexed and transmitted at intervals of 50 GHz. In order to further increase the communication capacity, a DWDM system with a wavelength interval of 25 GHz has also been studied. In order to realize this, a light source with a large number of output wavelengths that are tunable along strict wavelength intervals is requested.

Related art is disclosed in see International Publication Pamphlet No. WO 2016/042658).

SUMMARY

According to an aspect of the embodiments, a wavelength tunable light source includes: a common wavelength filter that has periodic transmission peak wavelengths or reflection peak wavelengths and is commonly used for a plurality of channels; a wavelength tunable filter that is coupled to the common wavelength filter and has a one-input and multiple-output configuration which has a plurality of output ports, and that has a plurality of transmission peak wavelengths corresponding to the plurality of channels at the plurality of output ports; and a plurality of gain media optically coupled to the plurality of output ports of the wavelength tunable filter, wherein a plurality of laser cavities that perform laser oscillation at a plurality of different wavelengths are formed between the common wavelength filter and the plurality of gain media.

DESCRIPTION OF EMBODIMENTS

In a four-wavelength laser device, a configuration using first to fourth individual wavelength selection filters and a fifth wavelength selection filter commonly used for four channels is may be used.

Laser devices individually select wavelengths by using individual ring filters having no correlation between channels. This requests a wavelength monitor or an adjustment mechanism for each channel, which increases the size of the laser device. Since pieces of light of respective wavelengths are amplified and output by individual semiconductor optical amplifiers (SOAs), a coupler for multiplexing the pieces of light of respective wavelengths into one fiber is separately requested. When a simple coupler is used for multiplexing, optical loss occurs. When multiplexing with a WDM coupler, additional wavelength adjustment is requested.

A small-sized wavelength tunable light source capable of outputting light having a large number of wavelengths with a simplified configuration and a control method of a tunable wavelength may be provided.

Figure 1:
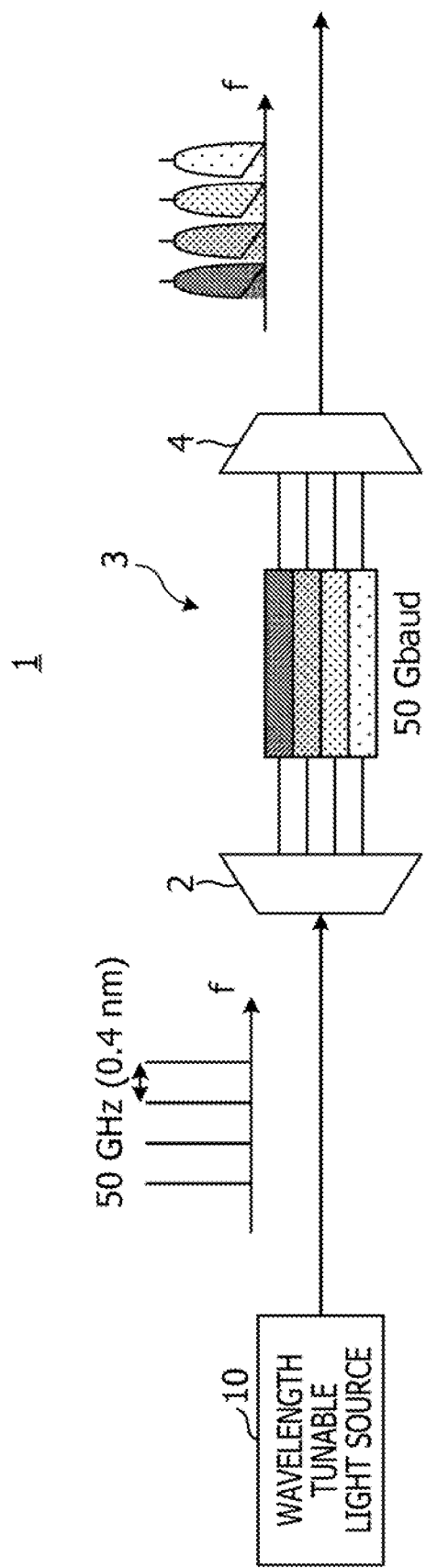
FIG. 1 is a schematic diagram of an optical transmission apparatus to which a wavelength tunable light source according to an embodiment is applied.

FIG. 1 is a schematic diagram of a transmission side of an optical transmission apparatus 1 using a wavelength tunable light source 10 of a present embodiment. The optical transmission apparatus 1 is a DWDM transmission apparatus, and includes the wavelength tunable light source 10, a demultiplexer 2, an optical modulator array 3, and a multiplexer 4 on the transmission side. The optical transmission apparatus 1 improves the spectrum utilization efficiency and transmission capacity of a transmitter by using a large number of wavelength channels arranged at high density at wavelength intervals of about a modulation symbol rate.

In an example in FIG. 1, the wavelength tunable light source 10 outputs light of four adjacent channels at 50 GHz intervals, but this is an example, and it is possible to output light of different wavelengths over several tens of channels. The wavelength interval may be 12.5 GHz, 25 GHz, 100 GHz, or the like. In this case, modulation baud rates are 12.5 Gbaud, 25 Gbaud, and 100 Gbaud, respectively.

As will be described later, the wavelength tunable light source 10 includes a common wavelength filter used in common among a plurality of channels. Oscillation wavelength intervals of a plurality of laser cavities are defined by one common wavelength filter having periodic transmission peaks or reflection peaks, thereby obtaining highly accurate wavelength intervals. For laser resonance at a plurality of wavelengths, one wavelength tunable filter of one-input and multiple-output type coupled to a common wavelength filter is used instead of providing an individual wavelength filter for each of the plurality of channels. As a result, wavelength intervals matched with the period of the transmission (or reflection) peak wavelengths of the common wavelength filter are obtained at the output ports of the wavelength tunable filter.

Optical signals modulated and multiplexed for respective wavelengths are multiplexed in one optical fiber and output to a transmission path.

A part of the output light of the wavelength tunable light source 10 may be used as local oscillation light for detecting an optical signal on a receiving side of the coherent optical transmission apparatus 1.

First Embodiment

Figure 2:
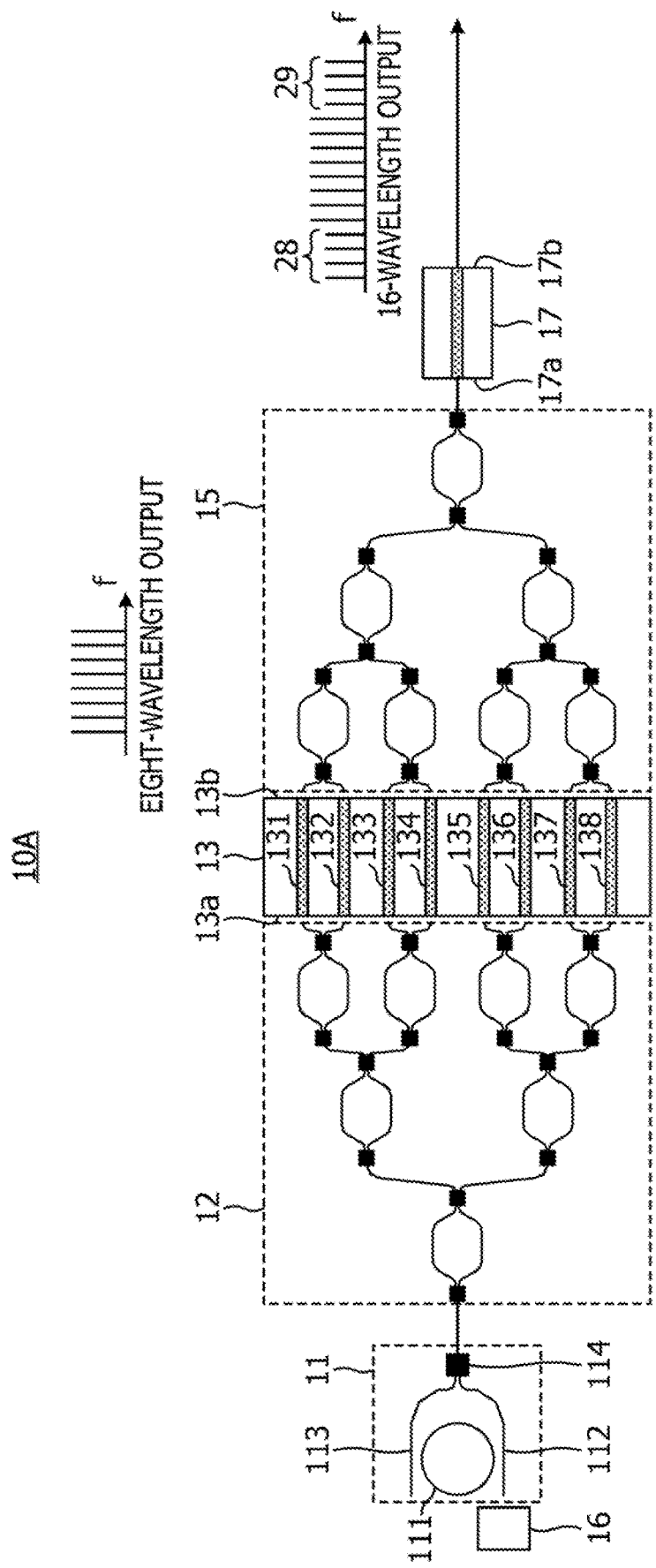
FIG. 2 is a schematic diagram of a wavelength tunable light source according to a first embodiment.

FIG. 2 is a schematic diagram of a wavelength tunable light source 10A according to a first embodiment. The wavelength tunable light source 10A includes a common wavelength filter 11, a wavelength tunable filter 12, a gain array 13, a second wavelength tunable filter 15, and an SOA 17 for collective amplification. A wavelength adjustment mechanism 16 may be optically coupled to the common wavelength filter 11.

The common wavelength filter 11 includes, for example, a ring resonator 111 formed of a Si waveguide, waveguides 112 and 113 arranged in the vicinity of the ring resonator 111, and an optical coupler 114 that couples the waveguides 112 and 113.

The ring resonator 111 has periodically varying peak wavelengths. A peak interval is determined by an effective optical path length (circumference) of the ring resonator 111. Light incident on the common wavelength filter 11 from the wavelength tunable filter 12 is branched by the optical coupler 114 and propagates to the waveguides 112 and 113. In the light coupled from the waveguide 112 to the ring resonator 111, the light components that match the peak wavelengths of the ring resonator 111 circulate in the ring resonator 111 and thus intensify each other due to interference. The light reaching a certain intensity is coupled to the waveguide 113, and enters the wavelength tunable filter 12 from the optical coupler 114. Similarly, in the light coupled from the waveguide 113 to the ring resonator 111, the light components that match the peak wavelengths of the ring resonator 111 circulate in the ring resonator 111 and thus intensify each other due to interference. The light reaching a certain intensity is coupled to the waveguide 112, and enters the wavelength tunable filter 12 from the optical coupler 114.

The wavelength tunable filter 12 has a one-input and multiple-output configuration. There is one port on a side adjacent to the common wavelength filter 11 and a plurality of ports on an opposite side. In this example, the wavelength tunable filter 12 is, for example, a filter in which Mach-Zehnder (MZ) interferometer waveguides formed of Si waveguides are coupled in a multi-stage tree shape. In FIG. 2, for convenience of illustration, each MZ interferometer is illustrated as having a pair of waveguides arranged symmetrically, but the wavelength tunable filter 12 is configured by asymmetric Mach-Zehnder interferometer (AMZI) waveguides.

Figure 3:
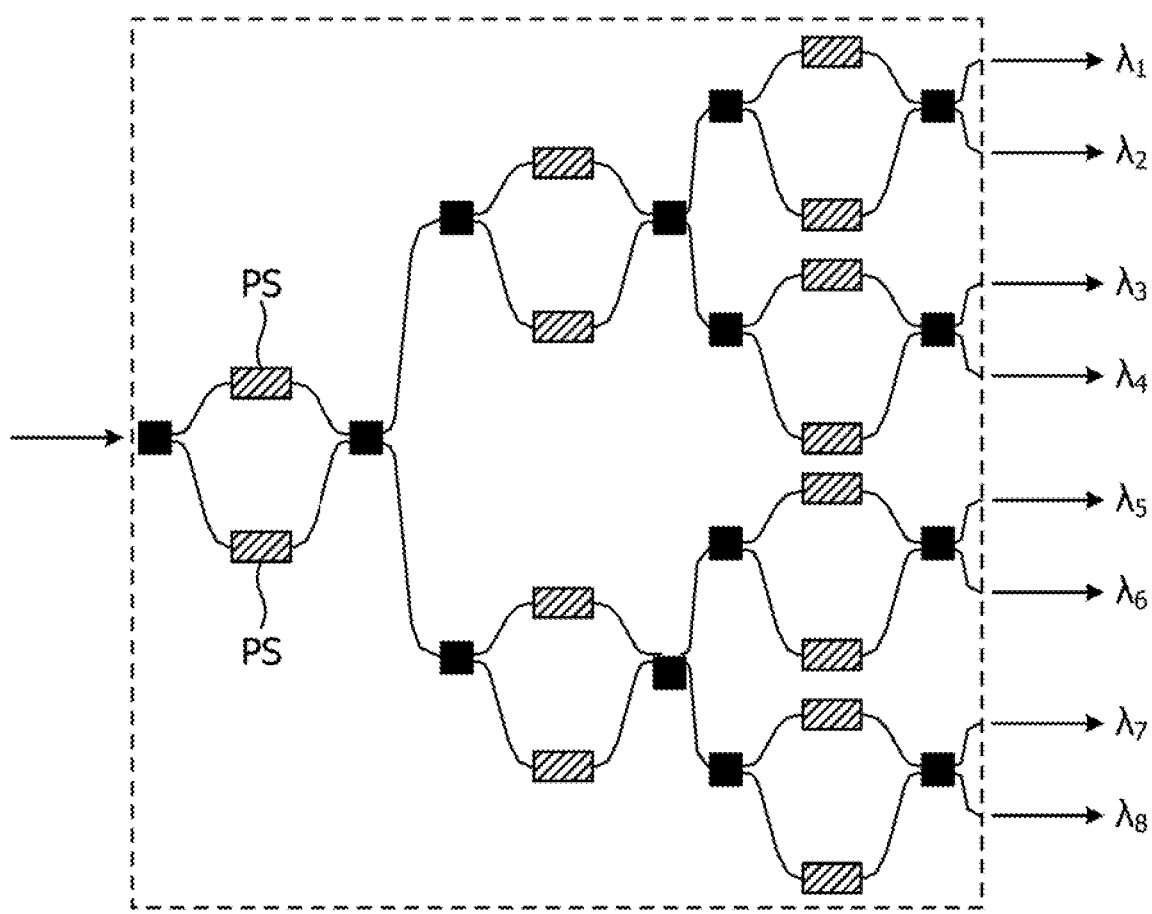
FIG. 3 is a diagram illustrating a specific configuration example of a wavelength tunable filter.

FIG. 3 illustrates a specific configuration example of the wavelength tunable filter 12 in FIG. 2. The lengths of the two waveguides (arms) are different in each of the plurality of AMZIs arranged so as to form a three-stage branch waveguide. The two pieces of light propagating through the two arms are multiplexed after being subjected to phase changes corresponding to effective optical path lengths of the respective arms (physical length of waveguide×effective refractive index). The optical output of the AMZI having an effective optical path length difference has periodic dependence on a reciprocal of the wavelength, and a desired wavelength interval may be designed by designing the arm length difference.

By providing a phase shifter PS such as a heater, electrodes, or the like in each arm of each AMZI, the refractive index of the waveguide may be adjusted to finely adjust the wavelength.

In a case of a multi-stage wavelength tunable filter, the number of AMZIs used in each stage increases by a power of two. In the three-stage configuration, the number of output ports of the wavelength tunable filter 12 is $2^3=8$ ports. Here, an example is used in which eight pieces of light of wavelengths of $\lambda_1$ to $\lambda_8$ are taken out from eight output ports, but the number of stages may be designed according to the number of wavelengths to be multiplexed.

As will be described later, the wavelength tunable filter 12 is not limited to the AMZI waveguide configuration, and various configurations such as a ring resonator type, a distributed feedback type, an arrayed waveguide type, and the like may be adopted.

Returning to FIG. 2, the gain array 13 in which a plurality of gain waveguides are formed is provided on a multiple-output side of the wavelength tunable filter 12. The gain array 13 is, for example, an SOA array formed of a compound semiconductor. The respective gain waveguides of the gain array 13 are gain media 131 to 138 provided individually at the output ports (for example, eight channels) of the wavelength tunable filter 12.

An anti-reflection (AR) film 13a is formed on an end face on an input side of the gain array 13, for example, an end face adjacent to the output port of the wavelength tunable filter 12. A low reflection (LR) film 13b is formed on an end face opposite to the face on which the anti-reflection film 13a is formed.

Between the ring resonator 111 and the respective gain media 131 to 138, respective laser cavities that perform laser oscillation at different wavelengths are formed. The light travels back and forth between the low reflection film 13b of each of the gain media 131 to 138 and the ring resonator 111, and a part of the light amplified due to stimulated emission is taken out from the low reflection film 13b. In an example in FIG. 2, eight pieces of light of different wavelengths $\lambda_1$ to $\lambda_8$ corresponding to the eight channels (see FIG. 3) are taken out from the gain array 13.

The gain media 131 to 138 are optically coupled to the second wavelength tunable filter 15 at the end faces on the output side on which the low reflection films 13b are provided. Similarly to the wavelength tunable filter 12, the second wavelength tunable filter 15 has the configuration of one-input and multiple-output (or multiple-input and one-output). The second wavelength tunable filter functions as a wavelength selection filter and at the same time functions as a multiplexer. At an output end of the second wavelength tunable filter 15, the eight pieces of light of different wavelengths are multiplexed and output.

The optical amplifier 17 is coupled to the output of the second wavelength tunable filter 15 functioning as the multiplexer. The optical amplifier 17 is, for example, a booster SOA formed of the compound semiconductor. An anti-reflection film 17a is formed on an incident side end face of the optical amplifier 17, and an anti-reflection film 17b is formed on an emission side end face.

The optical amplifier 17 collectively amplifies the light having the different multiple wavelengths. Thus, high optical output and power efficiency are realized. Four-wave mixing (FWM) in the SOA increases the number of output wavelengths. Additional wavelength channels 28 and 29 generated by FWM are generated, for example, on a low frequency side and a high frequency side of the wavelength band including the original eight wavelengths.

In FIG. 2, the one-input and multiple-output wavelength tunable filter 12 is coupled to the common wavelength filter 11, and the gain array 13 having the plurality of gain media 131 to 138 is optically coupled to the output ports of the wavelength tunable filter 12. The number and size of the wavelength filters and the size of the gain medium may be reduced, and thus the wavelength tunable light source 10A may be downsized as a whole. When the optical amplifier 17 is used as the booster SOA, the number of wavelengths may be increased.

In the wavelength tunable filter 12, the plurality of wavelength filters correlated with each other are formed by the AMZIs coupled in the multi-stage in a tree or a tournament bracket shape. Therefore, it is not requested to monitor or adjust the wavelengths individually for the respective wavelength filters, and the burden of monitoring and fine adjustment for the respective wavelengths is reduced. Wavelength monitoring and control in the wavelength tunable light source of the embodiment will be described later with reference to FIG. 6.

Figure 4:
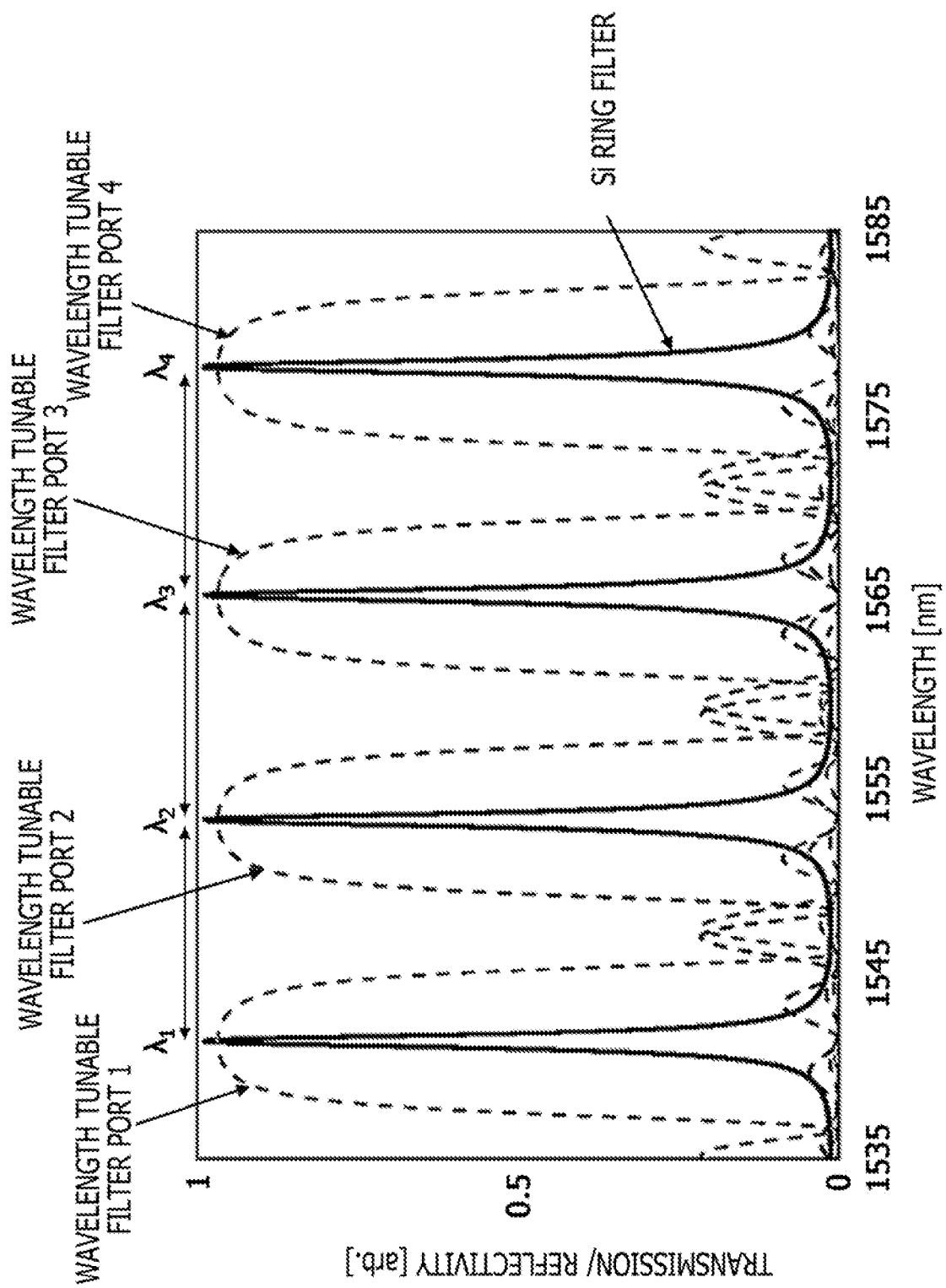
FIG. 4 is a diagram illustrating transmission spectra of respective wavelength filters.

FIG. 4 illustrates transmission spectra of respective filters of the wavelength tunable light source 10A in FIG. 2. A solid line is a periodic transmission spectrum of the ring resonator 111 of the common wavelength filter 11. Four different broken lines are transmission spectra at the four output ports of the wavelength tunable filter 12.

Center wavelengths of the transmission spectra at respective output ports of the wavelength tunable filter 12 substantially match the periodic peak wavelengths $\lambda_1$ to $\lambda_4$ of the ring resonator 111 of the common wavelength filter 11.

In the configuration in FIG. 2, the individual wavelengths are selected by the one wavelength tunable filter 12, and are resonated by the one common wavelength filter 11 having the periodic transmission peaks or reflection peaks. This configuration allows the peak wavelength intervals between the output ports to match the intervals between the peaks of the ring resonator 111.

Second Embodiment

Figure 5:
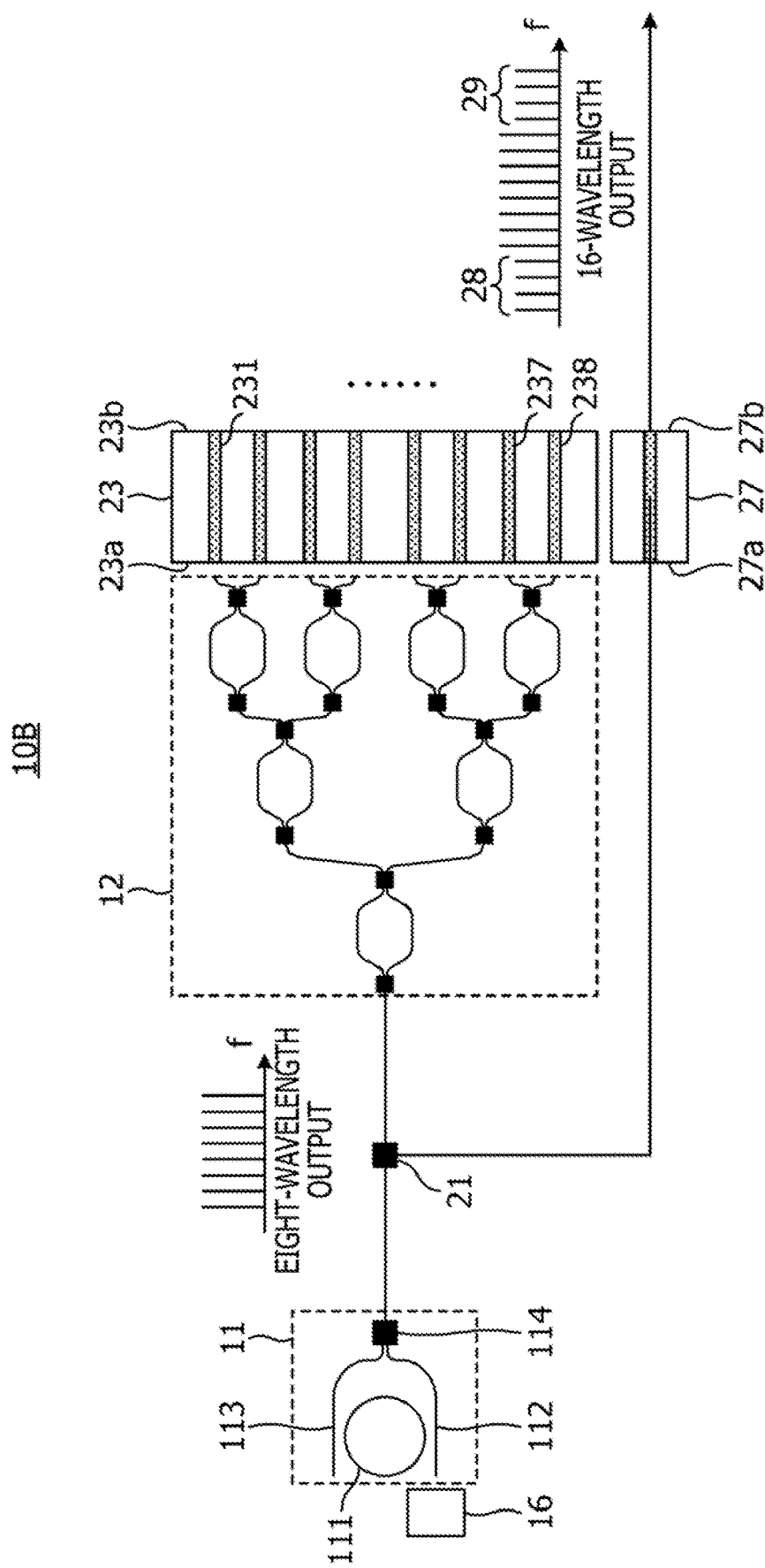
FIG. 5 is a schematic diagram of a wavelength tunable light source according to a second embodiment.

FIG. 5 is a schematic diagram of a wavelength tunable light source 10B according to a second embodiment. In the first embodiment, the second wavelength tunable filter 15 is used on the output side of the gain array 13 to multiplex the plurality of pieces of light of the wavelengths. In the second embodiment, the plurality of pieces of light of the wavelengths are multiplexed and collectively amplified without using the second wavelength tunable filter. The collective amplification may not be requested, and a configuration that outputs the light of the plurality of wavelengths corresponding to the original channels is possible.

The wavelength tunable light source 10B includes the common wavelength filter 11, the wavelength tunable filter 12, a gain array 23, an output tap 21 provided between the common wavelength filter 11 and the wavelength tunable filter 12, and an optical amplifier 27 coupled to the output tap 21. A wavelength adjustment mechanism 16 may be optically coupled to the common wavelength filter 11.

The common wavelength filter 11 is the same as the common wavelength filter 11 of the first embodiment, and includes the ring resonator 111 formed of the Si waveguide, the waveguides 112 and 113 arranged in the vicinity of the ring resonator 111, and the optical coupler 114 that couples the waveguides 112 and 113.

As in the first embodiment, the wavelength tunable filter 12 has the one-input and multiple-output configuration. There is one port on a side adjacent to the common wavelength filter 11 and a plurality of ports on an opposite side. In this example, the wavelength tunable filter 12 is, for example, a filter in which Mach-Zehnder (MZ) interferometer waveguides formed of Si waveguides are coupled in a multi-stage tree shape. In FIG. 5, for convenience of illustration, for each MZ interferometer is illustrated as having the pair of waveguides arranged symmetrically, but the wavelength tunable filter 12 is actually configured by the AMZI waveguides, each having the effective optical path length difference between the two arms, as illustrated in FIG. 3.

The gain array 23 in which a plurality of gain waveguides are formed is provided on the multiple-output side of the wavelength tunable filter 12. The gain array 23 is, for example, the SOA array formed of the compound semiconductor. The respective gain waveguides of the gain array 23 are gain media 231 to 238 provided individually at the output ports (for example, eight channels) of the wavelength tunable filter 12.

An anti-reflection film 23a is formed on an end face on an input side of the gain array 23, for example, an end face adjacent to the output port of the wavelength tunable filter 12. Unlike the first embodiment, a high reflection (HR) film 23b is formed on an end face opposite to the end face on which the anti-reflection film 23a is formed.

Between the ring resonator 111 and the respective high reflection films 23b of the gain media 231 to 238, respective laser cavities that perform laser oscillation at different wavelengths are formed. The light travels back and forth between each of the gain media 231 to 238 and the ring resonator 111 and is amplified due to the stimulated emission. The pieces of light reflected by the high reflection films 23b pass through the wavelength tunable filter 12 along optical paths in the opposite directions of the pieces of light entering the gain array 23 and are multiplexed at the one port on the input side of the wavelength tunable filter 12.

A part of the amplified and multiplexed light (a fixed ratio of the optical power propagating through the waveguide coupling the wavelength tunable filter 12 and the common wavelength filter 11) is taken out from the output tap 21 between the common wavelength filter 11 and the wavelength tunable filter 12. For example, the light having the different wavelengths $\lambda_1$ to $\lambda_8$ corresponding to the eight channels (see FIG. 3) is taken out from the output tap 21.

The light including the plurality of different wavelengths is collectively amplified by the optical amplifier 27, which is the booster SOA, and output. An anti-reflection film 27a and an anti-reflection film 27b are formed on an incident side end face and an emission side end face of the optical amplifier 27, respectively.

As described above, the optical amplifier 27 may not be requested, but by providing the optical amplifier 27, the light having the multiple wavelengths is collectively amplified, and high optical output and power efficiency are realized. Four-wave mixing (FWM) in the SOA increases the number of output wavelengths. Additional wavelength channels 28 and 29 generated by FWM are generated, for example, on a low frequency side and a high frequency side of the wavelength band including the original eight wavelengths.

In the configuration in FIG. 5, the one-input and multiple-output wavelength tunable filter 12 is coupled to the common wavelength filter 11, and the gain array 23 having the plurality of gain media 231 to 238 is optically coupled to the output ports of the wavelength tunable filter 12. The plurality of resonant waveguides formed in the AMZI tree structure are folded back at the gain array 23, and the overall size of the wavelength tunable light source 10B may be further reduced.

When the light having the plurality of wavelengths multiplexed by the wavelength tunable filter 12 is collectively amplified by the optical amplifier 27, which is the booster SOA, the number of wavelengths may be increased by using four-wave mixing in the SOA.

Also in the wavelength tunable light source 10B of the second embodiment, as described with reference to FIG. 4, the center wavelengths of the transmission spectra at the respective output ports substantially match the periodic peak wavelengths of the ring resonator 111 of the common wavelength filter 11. As a result, highly accurate wavelength intervals may be obtained with the small-sized wavelength tunable light source 10B.

<Control of Tunable Wavelength>

Figure 6:
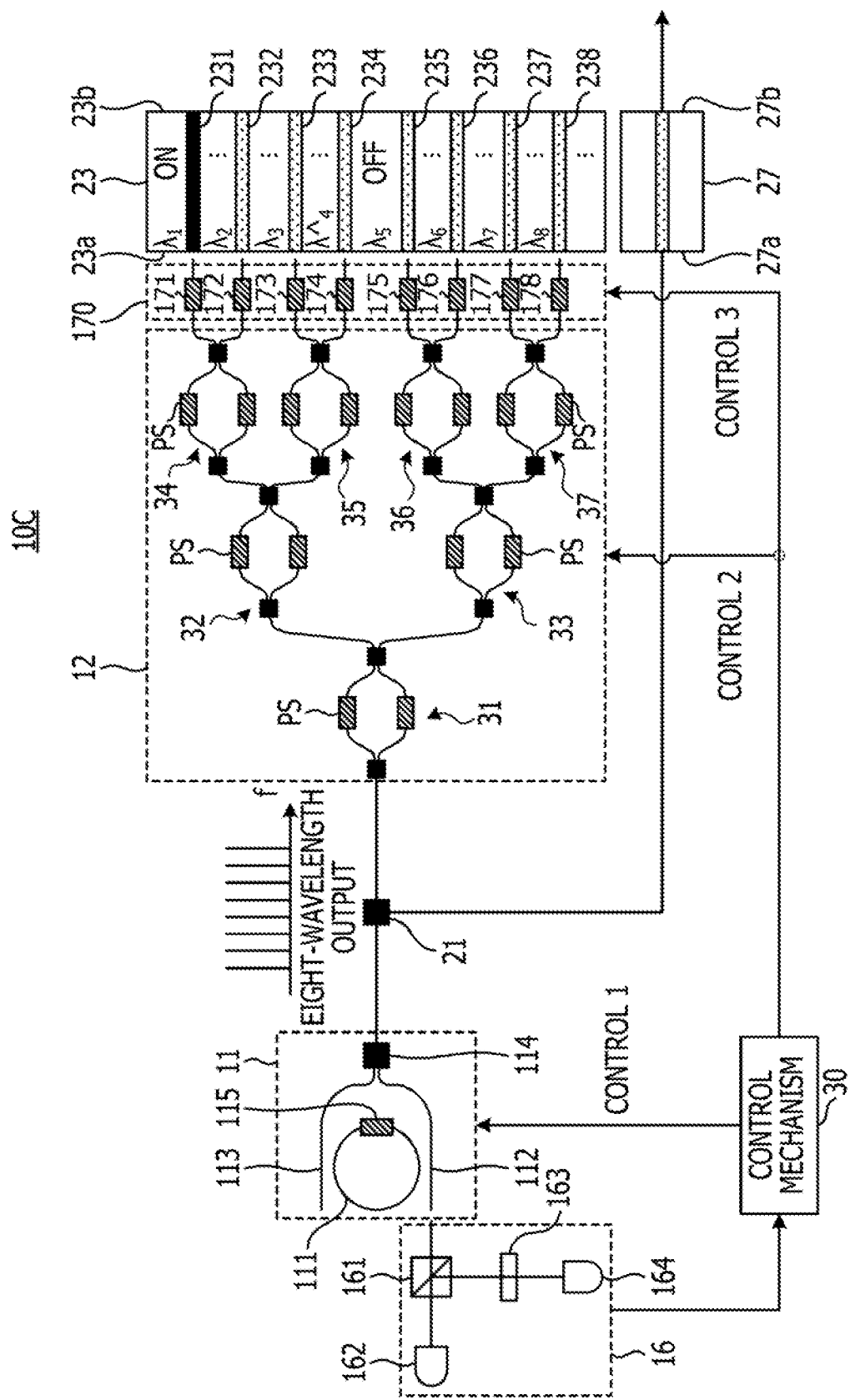
FIG. 6 is a diagram illustrating a configuration for tunable wavelength control.

FIG. 6 is a schematic diagram of a wavelength tunable light source 10C used for controlling a tunable wavelength. The wavelength tunable light source 10C has a configuration folded back at the gain array 23 as in the second embodiment. A plurality of laser cavities that perform laser oscillation at different wavelengths are formed between the common wavelength filter 11 and the end faces of the respective gain media 231 to 238 of the gain array 23 on which the high reflection films 23b are formed. The wavelength tunable filter 12 functions as the wavelength selection filter that selects the respective wavelengths and at the same time functions as the multiplexer that multiplexes the pieces of light amplified by the gain media 231 to 238.

A part of the light of respective wavelengths amplified due to the stimulated emission is taken out from the output tap 21 between the common wavelength filter 11 and the wavelength tunable filter 12, collectively amplified by the optical amplifier 27, and output.

In an example in FIG. 6, a longitudinal mode adjusting unit 170 is arranged between the wavelength tunable filter 12 and the gain array 23. Although the longitudinal mode adjusting unit 170 may not be requested, by inserting the longitudinal mode adjusting unit, each laser resonator may oscillate a laser with a stable single wavelength.

The wavelength tunable light source 10C is provided with the wavelength adjustment mechanism 16, and wavelength control is performed based on the output of the wavelength adjustment mechanism 16. In an example in FIG. 6, a part of the light resonated in the ring resonator 111 of the common wavelength filter 11 is taken out from the waveguide 112 and input to the wavelength adjustment mechanism 16.

The wavelength adjustment mechanism 16 includes, for example, a beam splitter 161, a photodetector 162, a filter 163 having a periodic transmission spectrum, and a photodetector 164. The beam splitter 161 splits the input light into two. One of the split pieces of light is detected by the photodetector 162, and the intensity is monitored. Another of the split pieces of light passes through the filter 163 and is then detected by the photodetector 164.

As the filter 163 having the periodic transmission spectrum, for example, an etalon filter may be used. By detecting the light intensity through the etalon filter, the oscillation wavelength may be monitored with high accuracy.

The output of the wavelength adjustment mechanism 16 is supplied to a control mechanism 30 and used for wavelength control of the wavelength tunable light source 10C. The control mechanism 30 may be realized by a microprocessor with a built-in memory, a logic device such as FPGA, or the like. The control using the wavelength adjustment mechanism 16 and the control mechanism 30 may be applied not only to the wavelength tunable light source 10C in FIG. 6 but also to the wavelength tunable light source 10A of the first embodiment and the wavelength tunable light source 10B of the second embodiment.

The control mechanism 30 may control the periodic transmission peak wavelength of the ring resonator 111 of the common wavelength filter 11 based on the output of the wavelength adjustment mechanism 16 (control 1). The ring resonator 111 is controlled by controlling a phase shifter 115 provided in the ring resonator 111. As an example, the temperature of the heater functioning as the phase shifter 115 is controlled to change the local temperature of the Si waveguide forming the ring resonator 111, thereby adjusting the effective refractive index sensed by the propagating light.

The control mechanism 30 controls at least some of the AMZIs 31 to 37 forming the wavelength tunable filter 12 based on the output of the wavelength adjustment mechanism 16 (control 2). The temperature of the wavelength selection waveguide may be controlled using at least some of the phase shifters PS provided in the respective arms of the AMZIs 31 to 37.

In the one-input and multiple-output wavelength tunable filter 12 of the embodiment, since the formed wavelength selection waveguides are correlated with each other, it may not be requested to control all AMZIs for each wavelength. An example of control of the wavelength tunable filter 12 will be described later.

The control mechanism 30 may control a longitudinal mode adjusting unit 170 based on the output of the wavelength adjustment mechanism 16 (control 3). As an example, the longitudinal mode adjusting unit 170 includes phase shifters 171 to 178 provided in the plurality of output ports of the wavelength tunable filter 12, respectively. The longitudinal mode may be adjusted by controlling at least some of the phase shifters 171 to 178.

In the wavelength tunable light sources 10A to 10C, it may not be requested to perform all of the control 1 to the control 3, and at least one of the control 1 to the control 3 may be performed based on the output of the wavelength adjustment mechanism 16.

In a state in FIG. 6, as an example, the gain medium 231 of the gain array 23 is turned on, and wavelength control is performed focusing on a channel using the gain medium 231. At this time, the other gain media 232 to 238 are turned off. When a next channel is selected for wavelength adjustment, the gain medium of the selected channel is turned on and the other channels are turned off.

After individual channels are controlled, all channels may be controlled. In the one-input and multiple-output wavelength tunable filter 12, since the plurality of waveguides for wavelength selection are correlated with each other, a large amount of entire wavelength adjustment is automatically performed when the wavelength adjustment of each channel is completed. When the entire wavelength adjustment is additionally performed in order to further improve the accuracy of the wavelength adjustment, all of the gain media 231 to 238 are turned on, and the wavelength tunable filter 12 is finely adjusted based on the output of the wavelength adjustment mechanism 16.

Figure 7:
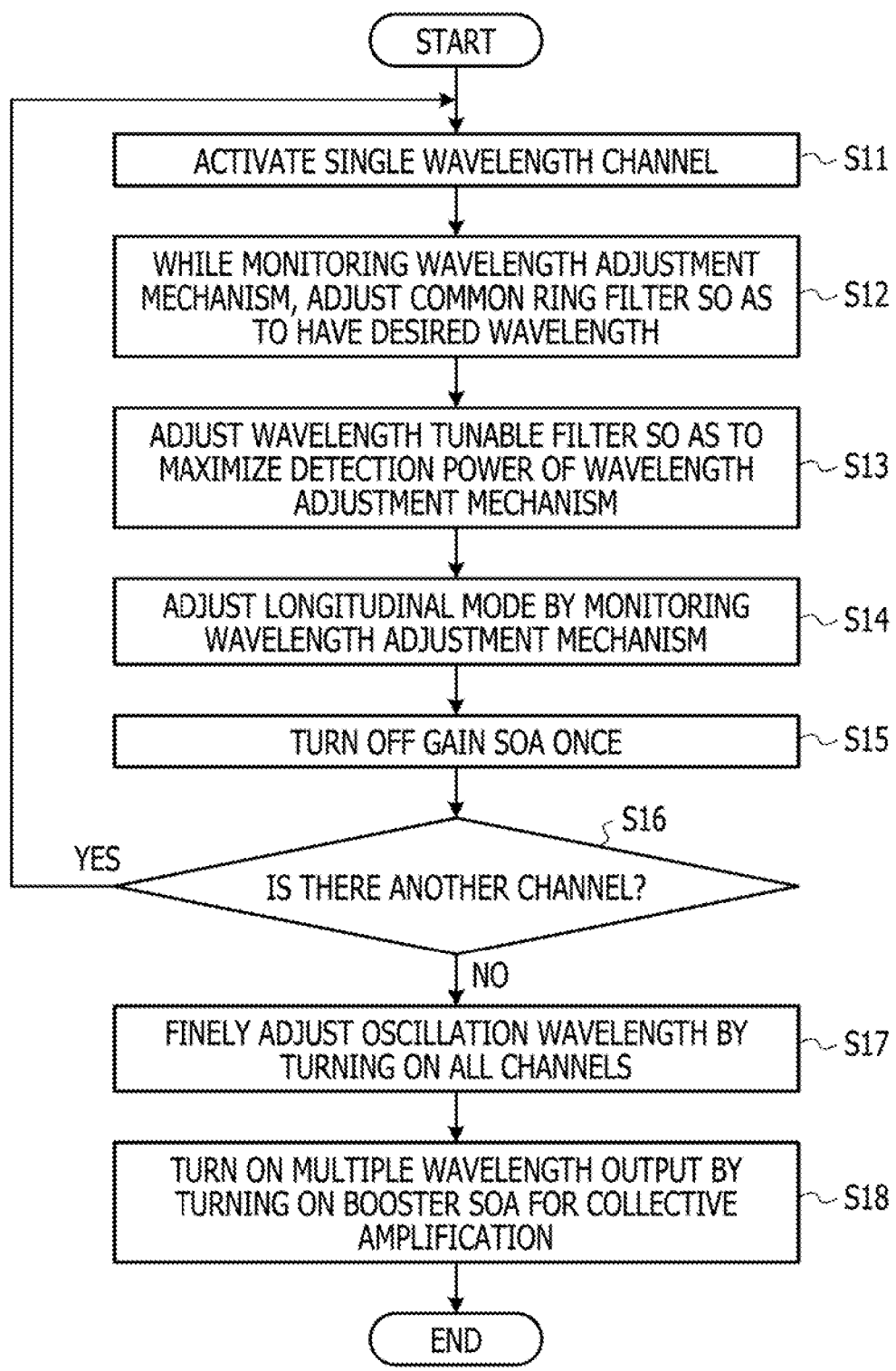
FIG. 7 is a flowchart of a method of controlling a wavelength tunable light source according to the embodiment.

FIG. 7 is a flowchart of a method of controlling the wavelength tunable light source according to the embodiment. This control flow is executed by the control mechanism 30. First, a channel of any one wavelength is activated (S11). For example, any one of the gain media 231 to 238 in the laser resonator is turned on to cause laser oscillation at a single wavelength.

Next, while monitoring the output of the wavelength adjustment mechanism 16, the ring resonator 111 of the common wavelength filter 11 is controlled so that the wavelengths of the periodic transmission peaks or reflection peaks have the desired wavelength intervals (S12).

The wavelength tunable filter 12 is controlled so that the detection power of the wavelength adjustment mechanism 16 becomes maximum (S13). The fact that the power of the light detected by the wavelength adjustment mechanism 16 is maximized means that the peak wavelength of the AMZI filter of the channel of interest matches the peak wavelength of the ring resonator 111.

Optionally, the longitudinal mode adjusting unit 170 is adjusted based on the output of the wavelength adjustment mechanism 16 (S14). The phase shifter (one of 171 to 178) of the corresponding channel is controlled to finely adjust the phase to a point at which the laser output of the channel is most stabilized against the mode hop phenomenon.

Thereafter, the gain SOA (gain array 23) is once turned off (S15). It is determined whether there is another channel to be controlled (S16), and when there is another channel, S11 and S13 to S16 are repeated. For a second and subsequent channels, the control of the ring resonator 111 of the common wavelength filter 11 (S12) may be skipped. When there is no other channel to be controlled, all the channels are turned on, the output of the wavelength adjustment mechanism 16 is monitored again, and the oscillation wavelengths are finely adjusted (S17). Thereafter, the optical amplifier 27, which is the booster SOA, is turned on to output the light having multiple wavelengths (S18).

In a loop from S11 to S16, the control of the wavelength tunable filters 12 of the second and subsequent channels (S13) is simpler than the wavelength control of the first channel. Alternatively, control of some channels may be skipped without controlling all of the second and subsequent channels.

For example, in FIG. 6, in the control of the first channel, the first stage AMZI 31, the second stage AMZI 32, and the third stage AMZI 34 are selected, and the wavelength $\lambda_1$ is adjusted using the phase shifter PS. When the wavelength $\lambda_1$ of the wavelength tunable filter 12 is adjusted, the wavelength $\lambda_2$ of the adjacent channel is also adjusted substantially accurately.

Accordingly, the adjustment of the second channel is skipped, and the wavelength $\lambda_3$ is adjusted in the third channel. At this time, since the first stage AMZI 31 and the second stage AMZI 32 have been accurately adjusted by the channel adjustment of $\lambda_1$, only the AMZI 35 of the third stage may be controlled. When the wavelength $\lambda_3$ of the wavelength tunable filter 12 is adjusted, the wavelength $\lambda_4$ of the adjacent channel is also adjusted substantially accurately. Therefore, the adjustment of the fourth channel may be skipped.

When the wavelength $\lambda_5$ is adjusted in the fifth channel, since the first stage AMZI 31 has already been adjusted, the second stage AMZI 33 and the third stage AMZI 36 are controlled. When the wavelength $\lambda_5$ of the wavelength tunable filter 12 is adjusted, the wavelength $\lambda_6$ of the adjacent channel is also substantially accurately adjusted, and the adjustment of the sixth channel (wavelength $\lambda_6$) may be skipped.

When the wavelength $\lambda_7$ is adjusted in the seventh channel, since the first stage AMZI 31 and the second stage AMZI 33 have already been adjusted, only the third stage AMZI 37 may be controlled. When the wavelength $\lambda_7$ of the wavelength tunable filter 12 is adjusted, the wavelength $\lambda_8$ of the adjacent channel is also adjusted substantially accurately. Therefore, the adjustment of the eighth channel may be skipped.

As described above, by coupling the one-input and multiple-output wavelength tunable filter 12 to the common wavelength filter 11, it is possible to increase the correlation between the respective channels and reduce the burden of adjusting the individual wavelengths.

Figure 8:
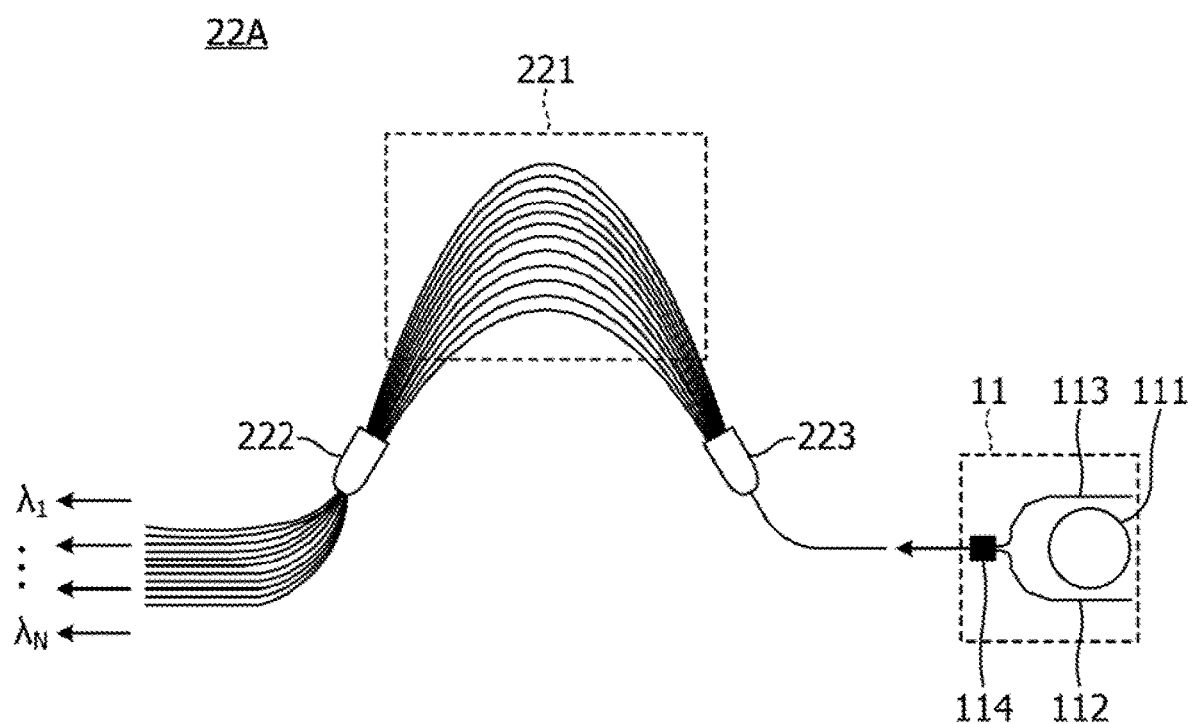
FIG. 8 is a modification of the wavelength tunable filter used in the wavelength tunable light source.

FIG. 8 illustrates a wavelength tunable filter 22A as a modification of the wavelength tunable filter 12. The wavelength tunable filter 22A is an array waveguide gratings (AWG) wavelength selection filter. A slab waveguide 223 is provided on an input side of an arrayed waveguide 221 formed of a plurality of arrayed waveguides having different effective optical path lengths, and a slab waveguide 222 is formed on an output side. The slab waveguide 223 on the input side is coupled to the common wavelength filter 11 by one input waveguide. The slab waveguide 222 on the output side couples the pieces of light incident from the plurality of arrayed waveguides to output waveguides having corresponding wavelengths.

In the AWG wavelength tunable filter 22A, the pieces of light may be coupled to different ports for respective wavelengths by using wavelength dispersion generated by the pieces of light propagating through a large number of arrayed waveguides having different effective optical path lengths. The wavelength interval may be designed by the lengths of the arrayed waveguides and the positions of the output ports. The pieces of light of wavelengths $\lambda_1$ to $\lambda_N$ output from the respective output ports of the slab waveguide 222 are incident on the corresponding gain media. The wavelength tunable filter 22A is also the one-input and multiple-output wavelength tunable filter.

Figure 9A:
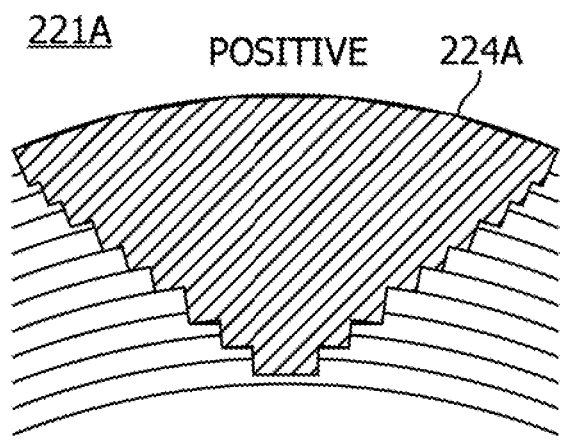
FIGS. 9A and 9B illustrate an adjustment structure of a peak wavelength in the wavelength tunable filter in FIG. 8.
Figure 9B:
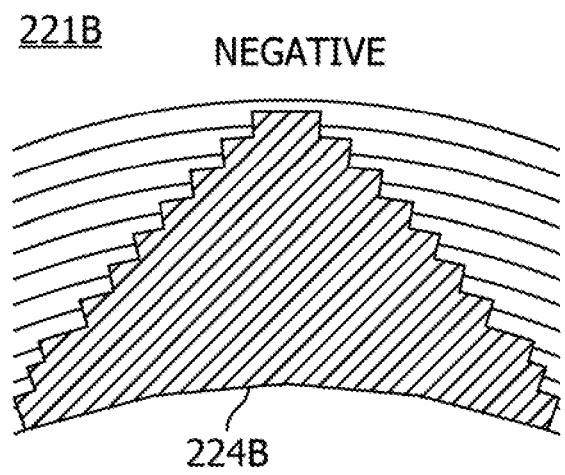

FIGS. 9A and 9B illustrate a structure for adjusting the peak wavelength of the wavelength tunable filter 22A in FIG. 8. In FIGS. 9A and 9B, an arrayed waveguide 221A and an arrayed waveguide 221B are provided with phase controllers 224A and 224B whose lengths are not uniform, respectively. In FIG. 9A, the length of a phase control region is longer in the outer (longer) arrayed waveguide. This configuration may be referred to as a positive filter. In FIG. 9B, the length of a phase control region is longer in the inner (shorter) arrayed waveguide. This configuration may be referred to as a negative filter. For example, the voltage applied to the phase controller 224A or 224B may be controlled to adjust the center peak wavelength of the AWG wavelength tunable filter.

Figure 10:
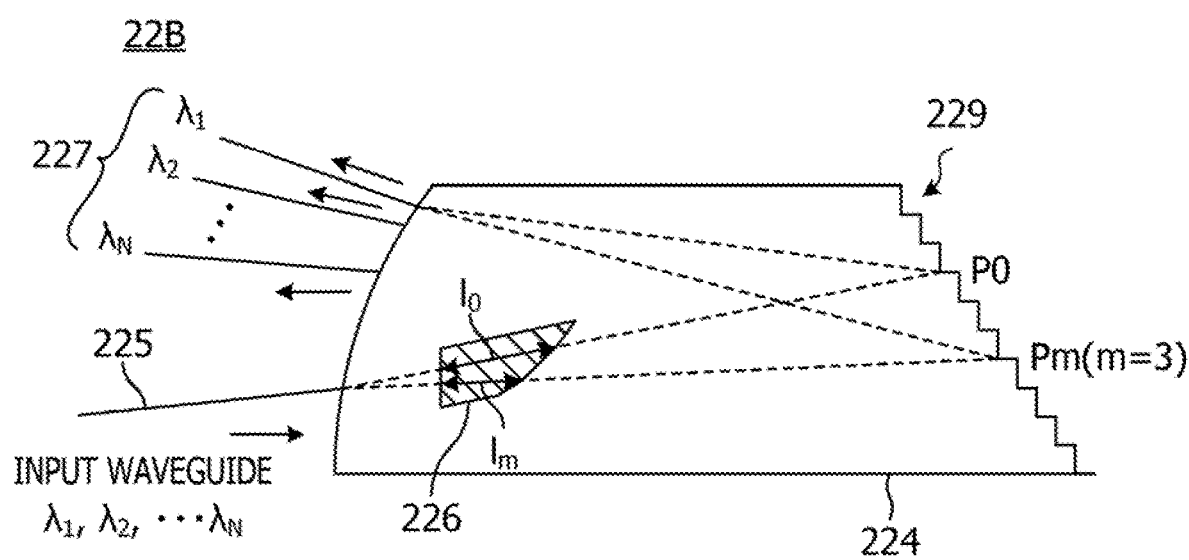
FIG. 10 is another modification of the wavelength tunable filter used in the wavelength tunable light source.

FIG. 10 illustrates a wavelength tunable filter 22B as another modification of the wavelength tunable filter 12. The wavelength tunable filter 22B is an echelle grating wavelength selection filter. The wavelength tunable filter 22B includes one input waveguide 225, a slab region 228, and N output waveguides 227. The input waveguide 225 and the N output waveguides 227 are arranged on the same side of the slab region 228.

The slab region 228 has a sidewall diffraction grating 229 at an end portion opposite to the input/output waveguides. In the sidewall diffraction grating 229, pieces of light of a plurality of orders (for example, zeroth to mth orders, m=3 in an example in FIG. 10) is diffracted in the same direction. The light emission position is changed for each wavelength by the wavelength dispersion effect of the sidewall diffraction grating 229, and the pieces of light of different wavelengths $\lambda_1$ to $\lambda_N$ are output for respective ports.

The peak wavelength may be finely adjusted by providing a wavelength control region 226 in the slab region 228 and changing the refractive index by temperature control or the like. The wavelength tunable filter 22B is also the one-input and multiple-output wavelength selection filter, and each of the plurality of output waveguides 227 is coupled to the corresponding gain medium.

Through the embodiments and the modifications, the wavelength tunable filter coupled to the common wavelength filter 11 has the one-input and multiple-output configuration and has the transmission peak wavelengths periodically arranged for the respective output ports. The oscillation wavelengths and intensities of the multiple channels are monitored by the common wavelength adjustment mechanism 16 and controlled by the common control mechanism 30. It is possible to achieve both multi-channel and miniaturization while maintaining the strict oscillation wavelength intervals by the common wavelength filter 11.

The present embodiments are not limited to the above-described configuration examples, and include various modifications and alternatives. For example, the resonator having the periodic transmission or reflection peaks of the common wavelength filter 11 is not limited to the ring resonator, and may be a racetrack type, a double ring type, an elliptical type, or the like. The wavelength tunable filter having the plurality of transmission peak wavelengths may be a ring resonator type instead of the AMZI type or the AWG type. In either case, a small-sized wavelength tunable light source maintaining strict wavelength intervals may be obtained.

In addition to the above description, the following appendices are presented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A wavelength tunable light source comprising: a common wavelength filter that has periodic transmission peak wavelengths or reflection peak wavelengths and is commonly used for a plurality of channels; a wavelength tunable filter that is coupled to the common wavelength filter and has a one-input and multiple-output configuration which has a plurality of output ports, and that perform an adjustment by a wavelength adjustment mechanism in such a manner that a plurality of transmission peak wavelengths corresponding to the plurality of channels match with each other at the plurality of output ports; a plurality of gain media optically coupled to the plurality of output ports of the wavelength tunable filter; and a second wavelength tunable filter that has a multiple-input and one-output configuration coupled to the plurality of gain medias, and same filter device structure and filter wavelength spacing as the wavelength tunable filter, wherein a plurality of laser cavities that perform laser oscillation at a plurality of different wavelengths are formed between the common wavelength filter and the plurality of gain medias, wherein an optical amplifier is coupled to the output of the second wavelength tunable filter.

2. The wavelength tunable light source according to claim 1, further comprising the optical amplifier that collectively amplifies outputs of the plurality of laser cavities.

3. The wavelength tunable light source according to claim 1, wherein each of the plurality of gain media includes a high reflection film on a face opposite side to the wavelength tunable filter, and an optical amplifier is coupled to an output tap between the common wavelength filter and the wavelength tunable filter.

4. The wavelength tunable light source according to claim 1, wherein the common wavelength filter includes a resonator that has the periodic transmission peak wavelengths or reflection peak wavelengths.

5. The wavelength tunable light source according to claim 1, further comprising a wavelength adjustment mechanism that is optically coupled to the common wavelength filter.

6. The wavelength tunable light source according to claim 5, wherein at least one of the common wavelength filter and the wavelength tunable filter is controlled based on an output of the wavelength adjustment mechanism.

7. The wavelength tunable light source according to claim 1, further comprising a longitudinal mode adjuster that adjusts longitudinal modes of the plurality of laser cavities.

8. The wavelength tunable light source according to claim 7, wherein the longitudinal mode adjuster is inserted between the output ports of the wavelength tunable filter and the plurality of gain media.

9. The wavelength tunable light source according to claim 1, wherein the wavelength tunable filter is a wavelength selection filter of an asymmetrical Mach-Zehnder interferometer type, an array waveguide gratings type, an echelle grating type, or a ring resonator type.

10. The wavelength tunable light source according to claim 1, wherein the plurality of gain media are arranged in parallel with each other and each of the plurality of gain media is coupled to the respective plurality of output ports via an anti-reflection film.

11. An optical transmission apparatus comprising: a wavelength tunable light source; a demultiplexer that demultiplexes output light of the wavelength tunable light source to respective plurality of pieces of light which have different wavelengths; an optical modulator array that modulates the respective plurality of pieces of light which have different wavelengths; and a multiplexer that multiplexes the pieces of output light of the optical modulator array, wherein the wavelength tunable light source includes: a common wavelength filter that has periodic transmission peak wavelengths or reflection peak wavelengths and is commonly used for a plurality of channels; a wavelength tunable filter that is coupled to the common wavelength filter and has a one-input and multiple-output configuration which has a plurality of output ports, and that perform an adjustment by a wavelength adjustment mechanism in such a manner that a plurality of transmission peak wavelengths corresponding to the plurality of channels match with each other at the plurality of output ports; a plurality of gain media optically coupled to the plurality of output ports of the wavelength tunable filter; and a second wavelength tunable filter that has a multiple-input and one-output configuration coupled to the plurality of gain medias, and same filter device structure and filter wavelength spacing as the wavelength tunable filter, wherein a plurality of laser cavities that perform laser oscillation at a plurality of different wavelengths are formed between the common wavelength filter and the plurality of gain medial wherein an optical amplifier is coupled to the output of the second wavelength tunable filter.

12. The optical transmission apparatus according to claim 11, wherein the plurality of gain media are arranged in parallel with each other and each of the plurality of gain media is coupled to the respective plurality of output ports via an anti-reflection film.

13. A method of controlling a wavelength tunable light source that performs laser oscillation at a plurality of different wavelengths, wherein the wavelength tunable light source includes:
   a common wavelength filter;
   a wavelength tunable filter that is coupled to the common wavelength filter and has a one-input and multiple-output configuration; and
   a plurality of gain media that are coupled to output ports of the wavelength tunable filter, and the method comprising:
   adjusting periodic transmission peak wavelengths or reflection peak wavelengths of the common wavelength filter to a desired wavelength interval in a state in which one channel in a plurality of channels of the wavelength tunable light source is activated;
   after the adjustment of the common wavelength filter, adjusting a transmission peak wavelength of the one channel of the wavelength tunable filter and transmission peak wavelengths of at least some of remaining channels to the wavelength interval of the common wavelength filter; and
   thereafter, amplifying and outputting outputs of all channels collectively.

14. The method of controlling a wavelength tunable light source according to claim 13, wherein the wavelength tunable filter includes a waveguide in which a plurality of asymmetrical Mach-Zehnder interferometers are coupled in a multi-stage tree shape, and the method further comprising: selecting every other output ports of the wavelength tunable filter; and controlling the transmission peak wavelength of the selected channel.

* * * * *